US008618721B2

(12) United States Patent
Ichikawa et al.

(10) Patent No.: US 8,618,721 B2
(45) Date of Patent: Dec. 31, 2013

(54) METHOD OF MANUFACTURING THE PIEZOELECTRIC DEVICE AND THE SAME

(75) Inventors: Ryoichi Ichikawa, Sayama (JP); Yoshiaki Amano, Sayama (JP); Kenji Kamezawa, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 102 days.

(21) Appl. No.: 13/208,799

(22) Filed: Aug. 12, 2011

(65) Prior Publication Data

US 2012/0043859 A1    Feb. 23, 2012

(30) Foreign Application Priority Data

Aug. 20, 2010  (JP) .................................. 2010-184970
Jun. 3, 2011   (JP) .................................. 2011-125614

(51) Int. Cl.
    *H01L 41/08*    (2006.01)
(52) U.S. Cl.
    USPC ........................................................ 310/344
(58) Field of Classification Search
    USPC ................................................. 310/344, 348
    See application file for complete search history.

(56) References Cited

U.S. PATENT DOCUMENTS

| 5,525,855 | A  | * | 6/1996  | Gotoh et al. ............. 310/344 |
| 5,886,457 | A  | * | 3/1999  | Maesaka et al. .......... 310/344 |
| 8,330,336 | B2 | * | 12/2012 | Kameda et al. ........... 310/344 |
| 8,362,676 | B2 | * | 1/2013  | Morita .................... 310/348 |
| 2003/0168943 | A1 | * | 9/2003 | Matsuyama et al. ....... 310/344 |
| 2011/0221309 | A1 | * | 9/2011 | Umeki .................... 310/344 |

FOREIGN PATENT DOCUMENTS

JP        2003-008382 A      1/2003

* cited by examiner

*Primary Examiner* — Mark Budd
(74) *Attorney, Agent, or Firm* — Alix, Yale & Ristas, LLP

(57) ABSTRACT

To provide a piezoelectric device prevented from overflowing of sealing materials. The piezoelectric device (100) stores a piezoelectric vibrating piece (30) having a pair of excitation electrodes. The piezoelectric device comprises: a package lid (10), including a first bonding surface (M1) formed in periphery of the package lid in a circumferential pattern and a lid recess (10); a package base (30), including a second bonding surface (M2), a base recess surrounded by a second bonding surface that is higher than the second bonding surface, and a pair of seats that is protruding from the base recess, situated for mounting the piezoelectric piece; a piezoelectric piece mounted onto the pair of seats; and a non electric conductive sealing material (48) disposed peripherally in relative to the first bonding surface and the second bonding surface in a circumferential pattern, thus the adhesive bonding the first bonding surface and the second bonding surface. Furthermore, height of the second bonding surface and the pair of seats are same height.

3 Claims, 15 Drawing Sheets

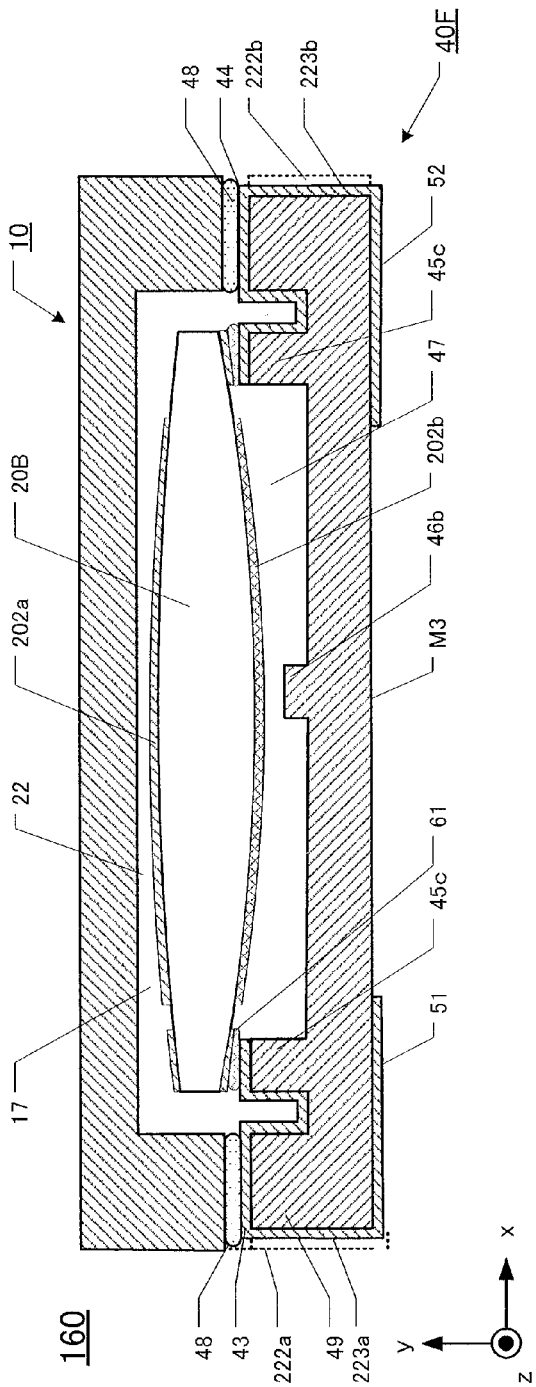

METHOD OF MANUFACTURING THE PIEZOELECTRIC DEVICE AND THE SAME

CROSS-REFERENCE TO RELATED APPLICATION

This application claims priority to and the benefit of Japan Patent Application No. 2010-184970, filed on Aug. 20, 2010 and Japan Patent Application No. 2011-125614, filed on Jun. 3, 2011, in the Japan Patent Office, the disclosures of which are incorporated herein by reference in their entirety.

FIELD

The present disclosure pertains to the methods for manufacturing a piezoelectric device in which the package lid and the package base are bonded by sealing material such as low-melting-point glass. This disclosure also pertains to the piezoelectric device thereof.

DESCRIPTION OF THE RELATED ART

Piezoelectric devices include piezoelectric vibrating pieces, quartz-crystal filters, quartz-crystal oscillators or SAW filters. Such piezoelectric devices usually include metal thin-film electrodes formed on the surface of the piezoelectric vibrating piece, and in order to protect the metal thin-film electrodes from atmosphere, the piezoelectric device is sealed in an airtight manner. Demand for surface-mountable type piezoelectric devices is increasing. To meet the increasing demand, various packaging approaches for bonding the package base and package lid have been used. For example, resin and low-melting-point glass are used as bonding materials.

The benefit of the bonding method using resin or low-melting-point glass is that the storing region of the piezoelectric device can be adjusted in relatively wide manner, since height of the package is adjustable. However, bonding packages with the resin or low-melting-point glass requires the control of amount of application and the condition after bonding. Too little adhesive can result in a package that is not air tight or a package that is not properly bonded. Excess adhesive causes adhesive overflow into the package and adhesive contact with the piezoelectric vibrating piece, which then causes characteristic failure of the device. Especially as the size of the package is made smaller, the resulting small internal cavity restricts the bonding region, with the result that device failures from adhesive overflow occur frequently.

Conventionally, in order to avoid adhesive from overflowing, Japanese unexamined patent document No 2003-008382 provides a region on the bonding surface of the package base, in which the adhesive is not being applied.

However, such method also forms a region where the sealing material is not applied at all. The region remains unapplied even after the adhesive is melted, thus causing the lowering of the bonding strength.

The present disclosure provides a piezoelectric device which is prevented from overflowing adhesive. The present disclosure also provides a method for manufacturing a piezoelectric device that is highly reliable in the bonding strength and reliability in airtightness of the package.

SUMMARY

The first aspect of the present disclosure is a piezoelectric device. The piezoelectric device stores a piezoelectric vibrating piece having a pair of excitation electrodes. The piezoelectric device comprises: a package lid, including a first bonding surface formed in periphery of the package lid in a circumferential pattern and a lid recess surrounded by the first bonding surface that is higher than the lid recess; a package base, including a second bonding surface disposed in relative to the first bonding surface a base recess surrounded by the second bonding surface that is higher than the second bonding surface, and a pair of seats that protrude from the base recess, situated for mounting the piezoelectric piece; a piezoelectric piece mounted onto the pair of seats; and a non electric conductive sealing material disposed peripherally between the first bonding surface and the second bonding surface in a circumferential pattern, for bonding the first bonding surface and the second bonding surface. Furthermore, the height of the second bonding surface and that of the pair of seats are the same.

The second bonding surface and a pair of seats are same height, thus reducing the manufacturing cost. Also, since the piezoelectric vibrating piece is mounted onto the pair of seats that protrude from the base recess, the piezoelectric vibrating piece is protected from the sealing material, even if the sealing material is applied more than necessary.

Also, the package base comprises a pair of external electrodes on a mounting surface formed on a side of the base opposite the second bonding surface, and a pair of connecting electrodes for connecting to the pair of external electrodes through the pair of seats.

Further, the pair of connecting electrodes comprises the pair of cut-through electrodes formed in a way that it cuts through the package base from the external electrodes. At least one side of the pair of cut-through electrodes cuts through to one side of the seats, and the other side of cut-through electrodes cuts through to a protruding portion situated on the package base. The height of the protruding portion is the same as that of the second connecting surface.

As viewed from above the package lid, the package base has a rectangular profile; and the package base comprises a pair of a castellations formed on the periphery of the rectangular profile; and a pair of connecting electrodes is formed extending from the pair of external electrodes to the pair of castellations and being connected to the pair of seats.

The piezoelectric device comprises a buffer protruding from the base recess, for protecting the piezoelectric piece when the piezoelectric piece is shaken due to an external shock. The height of buffer is formed in the same as that of the second bonding surface.

The second aspect of the disclosure is a method for manufacturing a piezoelectric device. The method for manufacturing a piezoelectric device comprises a step of preparing a lid wafer including a plurality of package lids having a first bonding surface formed peripherally in a circumferential pattern, and a lid recess surrounded by a first bonding surface that is higher than the lid recess; a step of preparing a base wafer including a plurality of package bases, having a second bonding surface formed in relative to the first bonding surface, a base recess surrounded by a second bonding surface that is higher than the base recess, and a pair of seats protruding from the base recess, the pair of seats are formed for mounting the piezoelectric device; disposing the piezoelectric piece onto the plurality of package base. The method comprises a step of forming a sealing material on the first bonding surface or the second bonding surface at a predetermined width in a circumferential pattern; and heating the base wafer and the lid wafer for bonding together, after forming the sealing material.

In the bonding step, since the piezoelectric vibrating piece is mounted onto the pair of seats that is protruding from the base recess, the piezoelectric vibrating piece is protected from the sealing material, even if the sealing material is applied more than necessary.

The step for preparing the base wafer comprises forming a pair of connecting electrodes which is connected from the pair of seats to the pair of external electrodes on a mounting surface formed on a side of the base opposite the pair of seats.

The sealing material is fabricated by a glass which melts at 350° C. to 410° C.

The manufacturing method of the piezoelectric device further comprises a step for cutting the piezoelectric device along scribe line after the bonding step.

In the piezoelectric device of this disclosure, the piezoelectric vibrating piece is protected from overflowing sealing material. Also, the method for manufacturing the piezoelectric device provides for mass production of piezoelectric devices with high reliability.

BRIEF DESCRIPTION OF THE DRAWINGS

FIG. 15A is a cross-section of the seventh quartz-crystal device 160 taken along C-C' line.

FIG. 15B is a cross-section of the seventh quartz-crystal device 160 taken along D-D' line.

DETAILED DESCRIPTION

First Embodiment

<Overall Configuration of the First Quartz-crystal Device 100>

The first quartz-crystal device 100 in the first embodiment will be described with reference to FIGS. 1A, 1B, and 2A-2C.

Figure 1A:
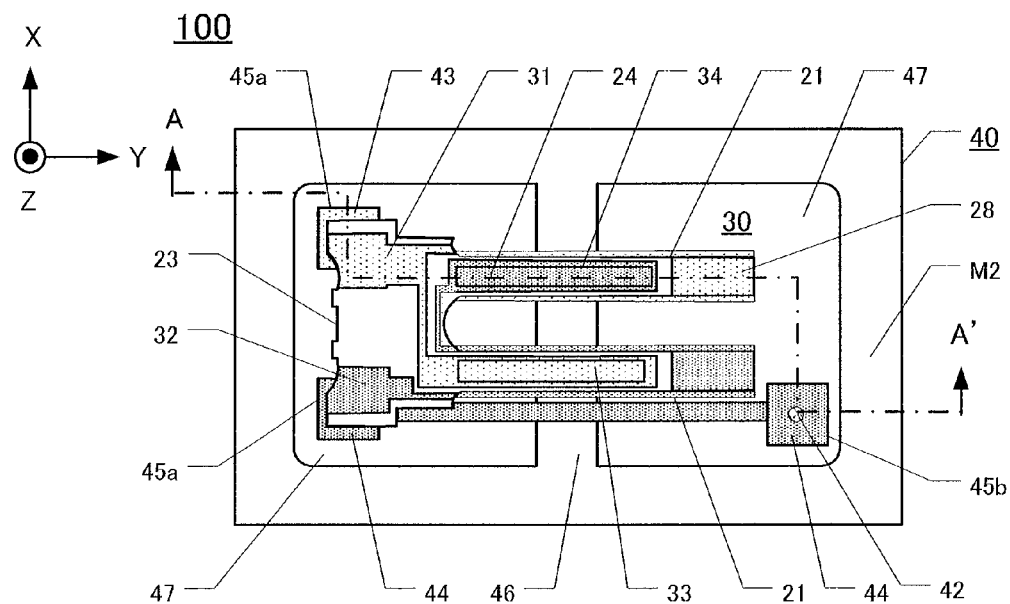
FIG. 1A is a plan view of the first quartz-crystal device 100 after mounting the tuning-fork type quartz-crystal vibrating piece 30.

FIG. 1A is a plan view of the surface-mountable first quartz-crystal device 100 comprising the tuning-fork type quartz-crystal vibrating piece 30.

Figure 1B:
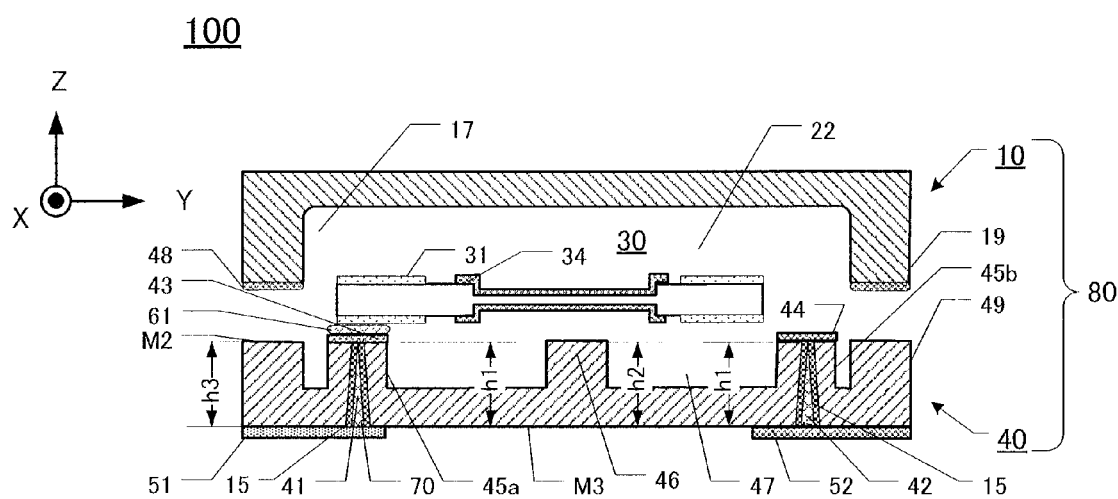
FIG. 1B is a cross-section of the first quartz-crystal device 100 taken along A-A' line.
Figure 2A:
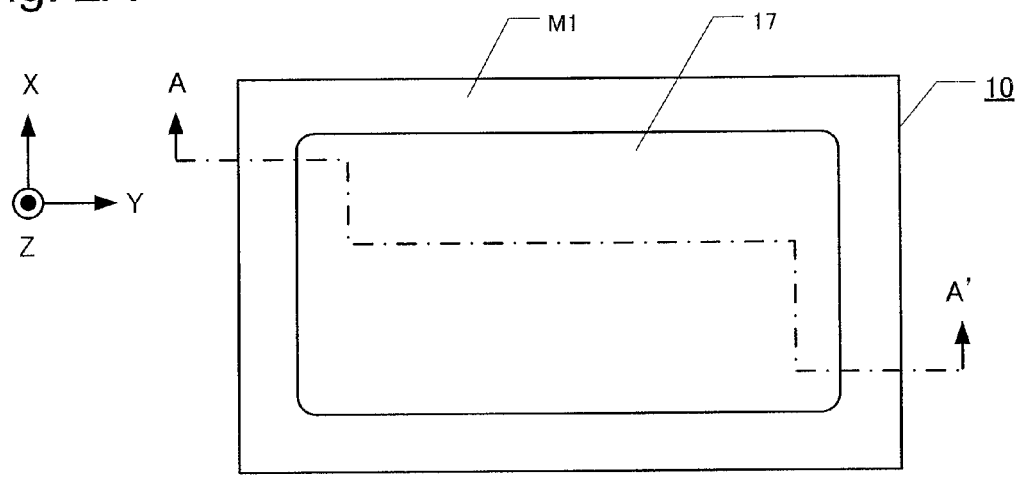
FIG. 2A is a plan view of the package lid 10.
Figure 2B:
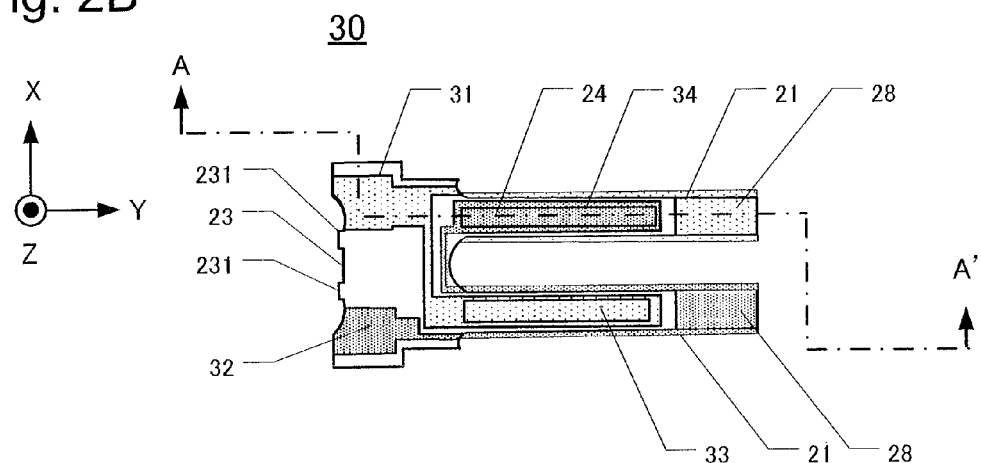
FIG. 2B is a plan view of the tuning-fork type quartz-crystal vibrating piece 30.
Figure 2C:
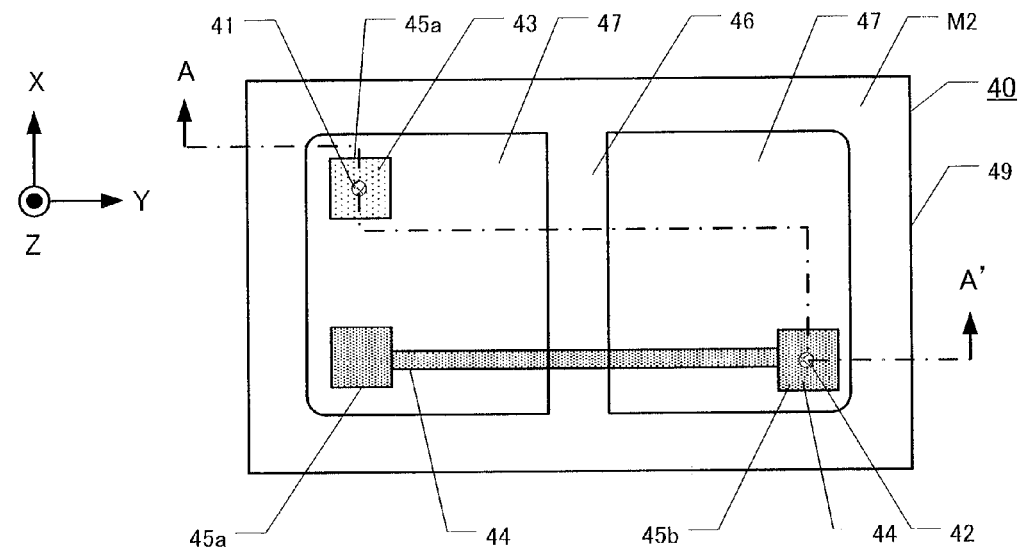
FIG. 2C is a top view of the package base 40.

FIG. 1A is an interior view of the first quartz-crystal device 100 containing the tuning-fork type quartz-crystal vibrating piece 30. The first quartz-crystal device 100 is shown with the package lid 10 removed and the tuning-fork type quartz-crystal vibrating piece 30 as a principal object. FIG. 1B is a cross-section of the first quartz-crystal device 100 taken along A-A' line. In this drawing, the package lid 10 and the first package base 40 are shown as separated. FIG. 2A is an inner view of the package lid 10, FIG. 2B is a plan view of the first tuning-fork type quartz-crystal vibrating piece 30 and FIG. 2C is a plan view of the first package base 40.

The first quartz-crystal device 100 comprises a package lid 10 and a first package base 40, which form the package 80 (refer to FIG. 1B). The package lid 10 has an inner surface facing toward the first package base 40 defining a concavity that forms a lid recess 17. The first package base 40 has an outer surface facing toward the first package lid 10 defining a concavity that forms a base recess 47. The lid recess 17 and base recess 47 forms the cavity 22 (refer to FIG. 1B). The tuning-fork type quartz-crystal vibrating piece 30 is mounted onto the cavity 22. The package lid 10 and the first package base 40 are fabricated of a quartz-crystal material.

The package lid 10 comprises a first bonding surface M1 (refer to FIG. 2A) on the frame 19. On the first bonding surface M1 of the package lid 10, a sealing material 48 (refer to FIG. 1B), which is non electric conductive sealing material made of low-melting-point glass, is applied in a circumferential pattern. The sealing material 48 can be applied onto the second bonding surface M2 of the first package base 40 in a circumferential pattern.

The tuning-fork type quartz-crystal vibrating piece 30 comprises a pair of vibrating arms 21 and a base 23, and the base 23 comprises the first extraction electrodes 31 and the second extraction electrodes 32 that are connected and conducted to respective first connecting electrodes 43 and second connecting electrodes 44 via electrically conductive adhesive 61. The first extraction electrodes 31 are connected to the first connecting electrodes 43, and the second extraction electrodes 32 are connected to the second connecting electrodes 44. On the pair of vibrating arms 21, a first excitation electrodes 33 and a second excitation electrodes 34 are formed on each front surface, back surface and side surfaces, and the first excitation electrodes 33 are connected to respective first extraction electrodes 31, and the second excitation electrodes 34 are connected to respective second extraction electrodes 32. On distal ends of respective vibrating arms 21, weights 28 are formed, which are coated with metal film. The grooves 24 are formed on both front and back surfaces of a pair of vibrating arms 21.

The first and second extraction electrodes 31, 32, the first and second excitation electrodes 33, 34 and weight 28 are all formed of a layer of gold (Au) having thickness of 150 Å to 500 Å (15 nm to 50 nm) formed on a layer of chromium (Cr) having thickness of 100 Å to 700 Å (40 nm to 80 nm). A layer of Nickel (Ni) or titan (Ti) metal can be formed instead of chromium (Cr) layer, and a layer of silver (Ag) can be formed instead of gold (Au).

As shown in FIGS. 1A, 1B and FIG. 2C, the first package base 40 has a base recess 47 on one side facing toward the package lid 10. By forming the base recess 47, a pair of seats 45a, a protruding portion 45b, a buffer 46 and a frame 49 are formed in a way that each protrudes from bottom surface of the base recess 47. The tuning-fork type quartz-crystal vibrating piece 30 is mounted on a seat 45. When forming the base recess 47 by etching, the first package base 40 forms a pair of seats 45a, the protruding portion 45b, the buffer 46, the frame 49, the first through-hole 41 and the second through-hole 42 all at once. The first through-hole 41 is formed on one side of a pair of seats 45a, and the second through-hole 42 is formed on the protruding portion 45b. The first connecting electrode 43 is formed on one side of the seat 45a, the second connecting electrode 44 is formed on the other side of the protruding portion 45b, and the second connecting electrode 44 extends to other end of the seat 45a. The buffer 46 is situated to prevent the tuning-fork type quartz-crystal vibrating piece 30 from external shock; even if a pair of vibrating arms 21 on the tuning-fork type quartz-crystal vibrating piece 30 trembles, the buffer 46 prevents the tip of a pair of vibrating arms 21 from striking the bottom surface of the base recess 47. If the buffer 46 is absent, when shock was applied from outside, the tip of the vibrating arms 21 may strike the bottom surface of the base recess 47, causing the tip of the vibrating arms being broken. When the tuning-fork type quartz-crystal vibrating piece 30 is disposed in parallel to XY-plane, the distance between the tuning-fork type quartz-crystal vibrating piece 30 and the buffer 46 equals to the thickness of the electrically conductive adhesive 61 and thickness of the first connecting electrode 43 combined.

The first package base 40 comprises a second bonding surface M2 on the frame 49. The shape and area of the second bonding surface M2 almost equals to the shape and area of the first bonding surface M1 on the package lid 10. On the mounting surface M3 of the first package base 40, the first external electrodes 51 and second external electrodes 52 are formed.

The metal film 15 is formed inside the surface of the first through-hole 41 and second through-hole 42. The first connecting electrode 43 is connected to the first external electrode 51 on the mounting surface M3 situated on the first package base 40 via metal film 15 formed on the first through-hole 41. The second connecting electrode 44 is connected to the second external electrode 52 on the mounting surface M3 situated on the first package base 40 via metal film 15 formed on the second through-hole 42. This means, the first extraction electrode 31 is electrically connected to the first external electrode 51, and the second extraction electrode 32 is electrically connected to the second external electrode 52. The first through-hole 41 and second through-hole 42 are sealed by eutectic metal 70.

The base recess 47 on the first package base 40 is formed by etching one plate of the quartz-crystal. The non-etched surfaces, such as a pair of seat 45a, the protruding portion 45b, buffer 46 and the frame 49 are formed with the same height as the mounting surface M3. Thus, height h1 of the pair of seats 45a, height h1 of the protruding portion 45b and height h2 of the buffer 46 are formed with same height as the height h3 of the frame 49 on the first package base 40. The quartz-crystal plate can be processed by sand-blast instead of etching (wet etching or dry etching).

<Manufacturing Method of the First Quartz-Crystal Device 100>

Figure 3:
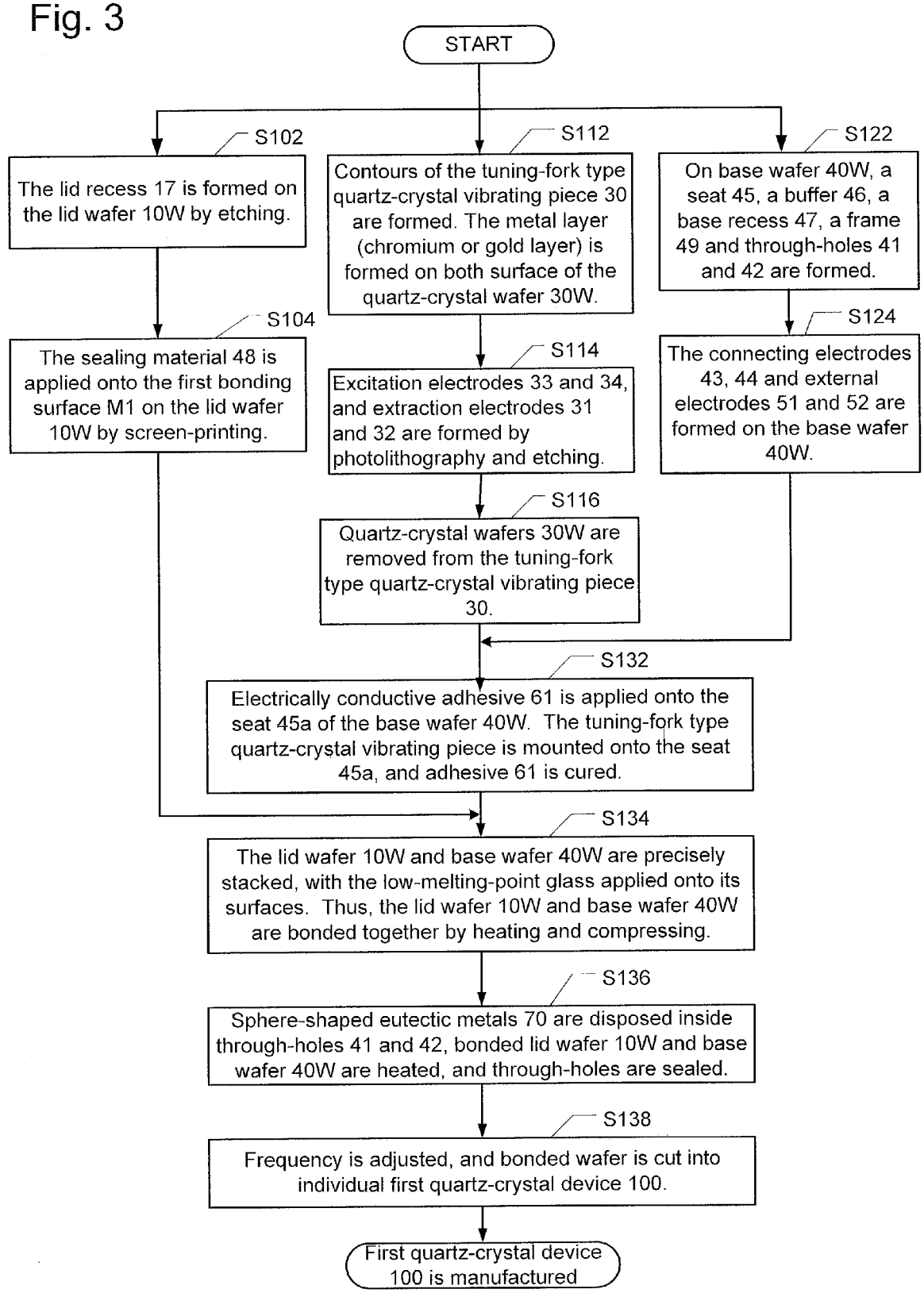
FIG. 3 is a flow-chart of steps of an embodiment of a method for manufacturing the first quartz-crystal device 100.
Figure 4:
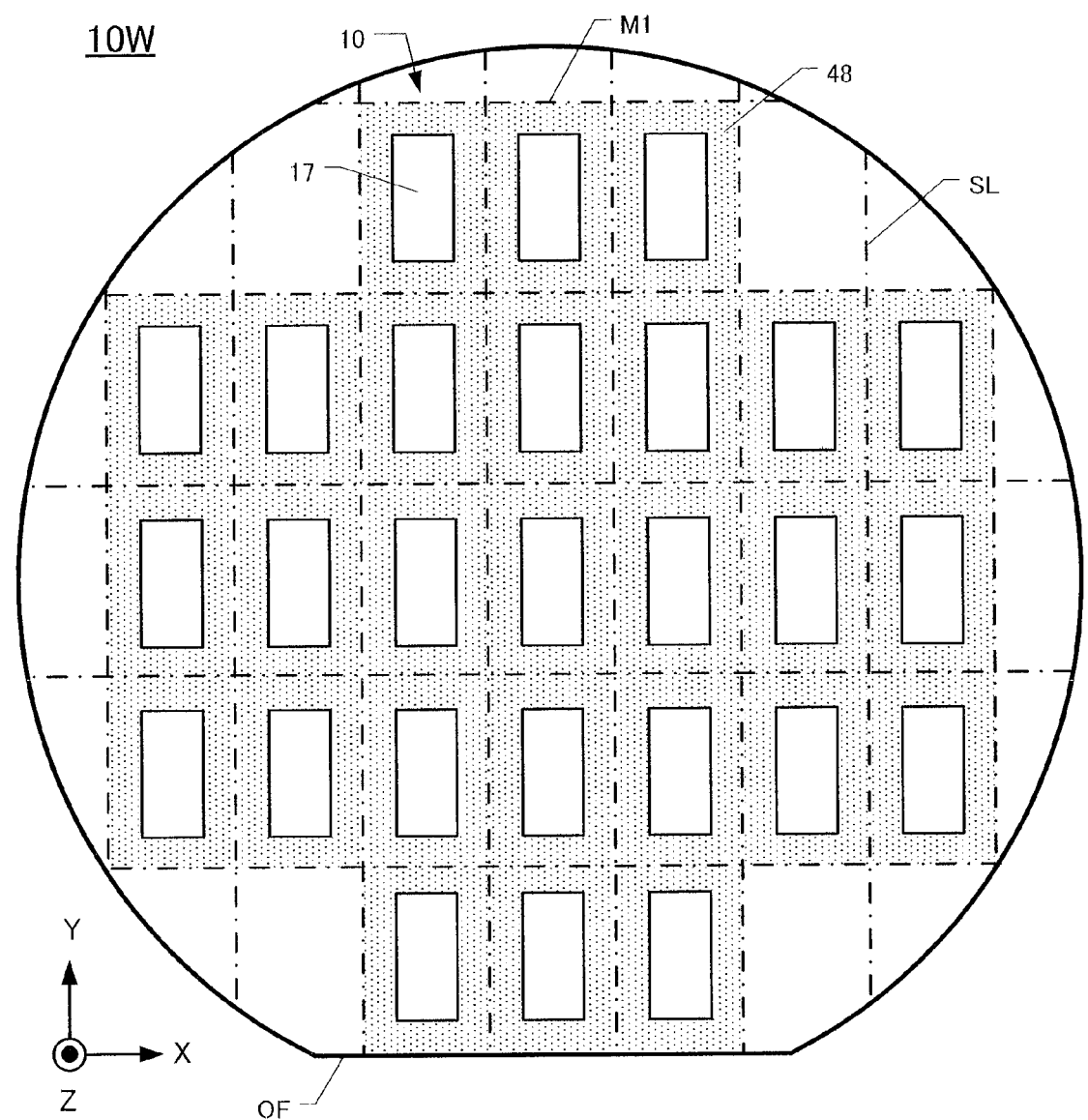
FIG. 4 is a plan view of the lid wafer 10W.
Figure 5:
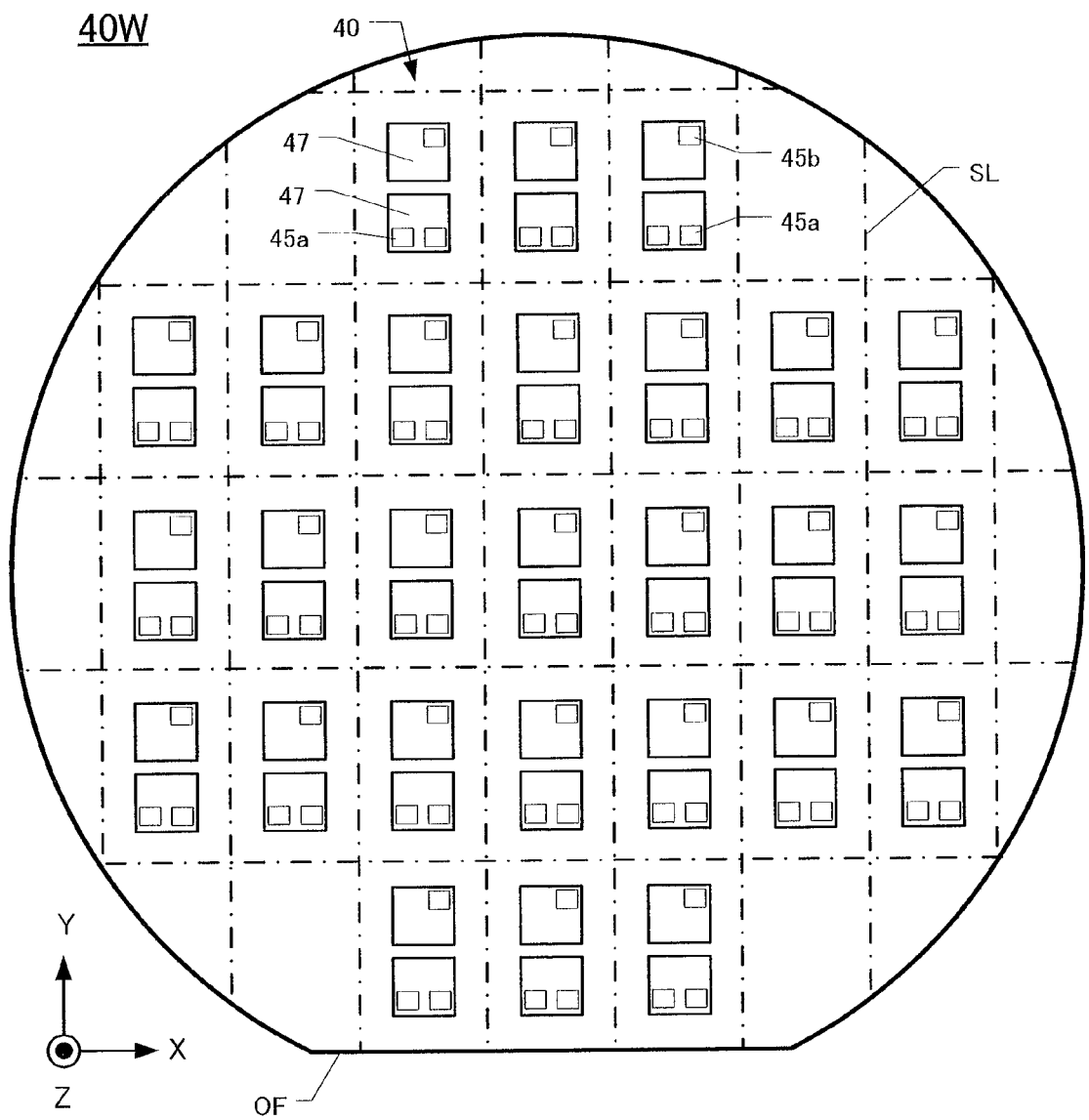
FIG. 5 is a plan view of the base wafer 40W.

FIG. 3 is a flow-chart of steps in an embodiment of a method for manufacturing the first quartz-crystal device 100. FIG. 4 is a plan view of the lid wafer 10W and FIG. 5 is a plan view of the base wafer 40W.

In step S102, a lid wafer 10W is prepared. As shown in FIG. 4, the lid wafer 10W has respective orientation flats OF on their outer edges, for denoting the crystal direction of the lid wafer 10W. The lid recess 17 is formed on the lid wafer 10W by etching.

In step S104, the sealing material 48 is uniformly applied onto the first bonding surface M1 (refer to FIG. 2A) on the frame 19 of the lid wafer 10W. The sealing material 48 is a vanadium-based low-melting point glass. The low-melting-point glass is applied onto the first bonding surface M1 on the frame 19 of the lid wafer 10W in a circumferential pattern. In order to prevent from surfaces not being thoroughly bonded, the low-melting-point glass is applied thicker. The low-melting-point glass goes through the preliminary curing.

In step S112, a plurality of outer contour of the tuning-fork type quartz-crystal vibrating piece 30 are formed on the quartz-crystal wafer 30W (not shown) by etching. The metal layer (chromium and gold layer) is formed on both surfaces of the quartz-crystal wafer 30W having contour of the tuning-fork type quartz-crystal vibrating piece 30 by sputtering or vacuum-deposition. An exemplary thickness of the chromium foundation layer is in the range of 150 Å to 500 Å, and an exemplary thickness of gold layer is in the range of 400 Å to 800 Å.

In step S114, a photoresist is uniformly applied on entire surface of the metal layer. Using an exposure tool (not shown), outline profiles of the excitation electrodes 33 and 34, and extraction electrodes 31 and 32 are imprinted in the photoresist layers on each main surface of the quartz-crystal wafer 30W. Next, regions of the metal layer denuded by removal of the photoresist are etched away. Thereby, respective excitation electrodes 33 and 34, and extraction electrodes 31 and 32 are formed on both surfaces of the tuning-fork type quartz-crystal vibrating piece 30, as shown in FIGS. 1 and 2.

In step S116, respective quartz-crystal wafer 30W is removed from the tuning-fork type quartz-crystal vibrating piece 30. Since the tuning-fork type quartz-crystal vibrating piece 30 are connected to the quartz-crystal wafer 30W via connecting end portion 231 on the base 23 (refer to FIG. 2B), the tuning-fork type quartz-crystal vibrating piece 30 are made individually by cutting from the connecting end portion 231.

In step S122, the base wafer 40W is prepared. As shown in FIG. 5, the base wafer 40W has respective orientation flats OF on their outer edges, for denoting the crystal direction of the base wafer 40W. The metal layer (chromium layer and gold layer) is applied onto the second bonding surface M2 by sputtering or vacuum-deposition. The photoresist is uniformly applied to entire surfaces of the metal layer. Using an exposure tool (not shown), outline profiles of the seat 45a, protruding portion 45b, buffer 46, base recess 47 and through-holes 41 and 42 are imprinted in the photoresist layers on the base wafer 40W. Next, regions of the metal layers exposed by removal of the photoresist are etched away, and exposed quartz-crystal materials are etched away. Respective unetched portions become the seat 45a, protruding portion 45b, buffer 46 and frame 49. The seat 45a, protruding portion 45b, buffer 46 and frame 49 are formed in one etching process, making the manufacturing process easier. Further, the through-holes 41 and 42 are formed during etching process.

In step S124, the photoresist is uniformly applied to metal layer of the base wafer 40W. Using an exposure tool (not shown), outline profiles of the electrodes are imprinted in the photoresist layers on the base wafer 40W. Next, regions of the metal layers exposed by removal of the photoresist are etched away. As shown in FIG. 1B and FIG. 2C, the first connecting electrodes 43 and second connecting electrodes 44 are formed on front surface of the first package base 40. The metal films 15 are formed on the first through-hole 41 and second through-hole 42. The first external electrode 51 and second external electrode 52 are formed on the mounting surface of the first package base 40.

In step S132, the electrically conductive adhesive 61 is applied onto the seat 45a on the first package base 40. The quartz-crystal vibrating piece mounting device (not drawn) mounts the tuning-fork type quartz-crystal vibrating piece 30 by vacuum-deposition, and stores it into the cavity 22 defined by the first package base 40. The tuning-fork type quartz-crystal vibrating piece 30 is mounted onto the seat 45a on the first package base 40. The respective positions of the cavity 22 and the seat 45a are determined by using a CCD camera (not shown), and the tuning-fork type quartz-crystal vibrating piece 30 is mounted to the seat 45a. Next, the respective connecting electrodes 43 and 44 on the tuning-fork quartz-crystal vibrating piece 30 and the seat 45a are electrically connected to the external electrodes 51 and 52 on outside of the package by going through the preliminary curing of the electrically conductive adhesive 61, followed by the curing.

In step S134, the first bonding surface M1 on the frame portion 19 of the lid wafer 10W having the low-melting-point glass, and the second bonding surface M2 on the frame portion 49 of the base wafer 40W are precisely stacked. The sealing material 48 is heated and the wafers are compressed at a temperature in the range of 350° C. to 400° C. Thus, the lid wafer 10W and base wafer 40W are bonded together.

Whenever the extra sealing material 48 is applied onto the first bonding surface M1, the extra sealing material 48 flows into the cavity 22 during the bonding step. To prevent from flowing, the gap is formed between the second bonding surface M2 and the seat 45a, as a part of the base recess 47. Even if the sealing material 48 flows into the cavity 22, the sealing material is prevented from contacting the tuning-fork type quartz-crystal vibrating piece 30. Similarly, the gap is formed between the second bonding surface M2 of the frame 49 and the protruding portion 45b.

In step S136, respective sphere-shaped eutectic metals 70 are disposed inside the first through-hole 41 and second through-hole 42, and bonded lid wafer 10W and base wafer 40W are heated at predetermined temperature in a vacuum or in a reflow oven containing inert-gas atmosphere. The eutectic metal 70 melts and the first through-hole 41 and second through-hole 42 are sealed. For example, if the eutectic metal 70 is Au12Ge alloy, the alloy is heated to 400° C. Thereby, a first quartz-crystal device 100 is manufactured, having a cavity 22 in a vacuum or filled with inert gas.

In step S138, the frequency is adjusted by irradiating a laser beam to the weight 28 on the tuning-fork type quartz-crystal vibrating piece 30 and evaporating a part of the metal film on the weight 28. Bonded wafer is cut into individual first quartz-crystal device 100 using a dicing unit such as dicing blade or wire saw. The first quartz-crystal device 100 goes through the quality test.

Second Embodiment

<Overall Configuration of the Second Quartz-crystal Device 110>

Figure 6:
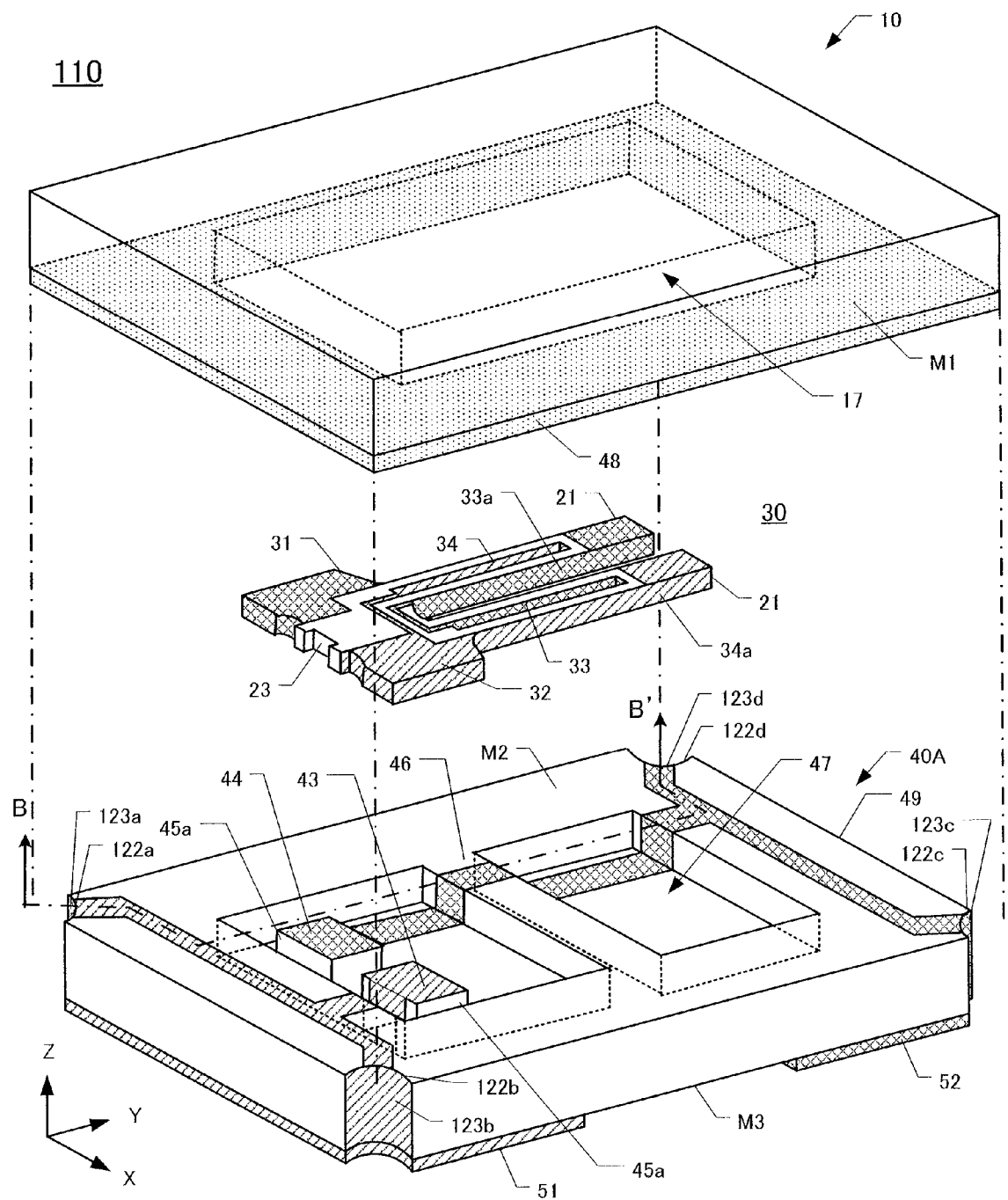
FIG. 6 is an exploded perspective view of the second quartz-crystal device 110.
Figure 7:
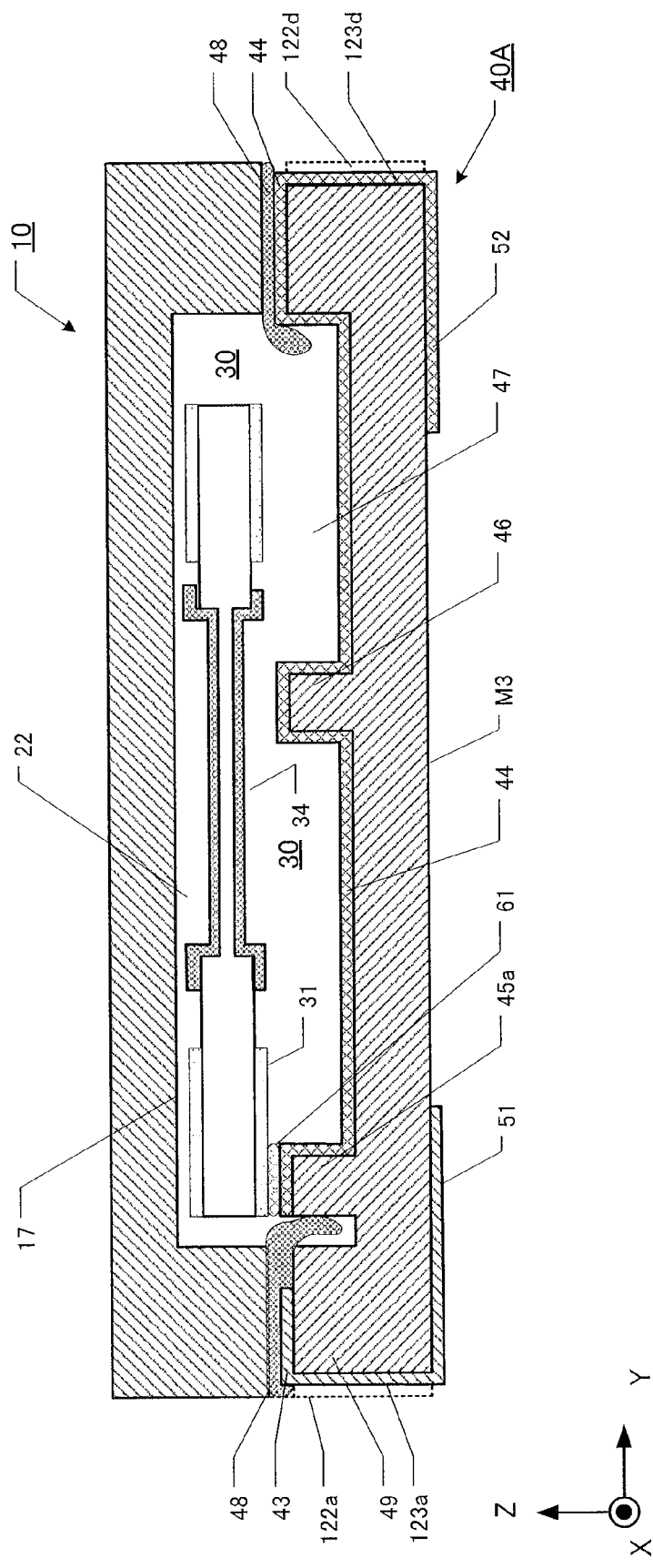
FIG. 7 is a cross-sectional view of the second quartz-crystal device 110 taken along B-B' line.
Figure 8:
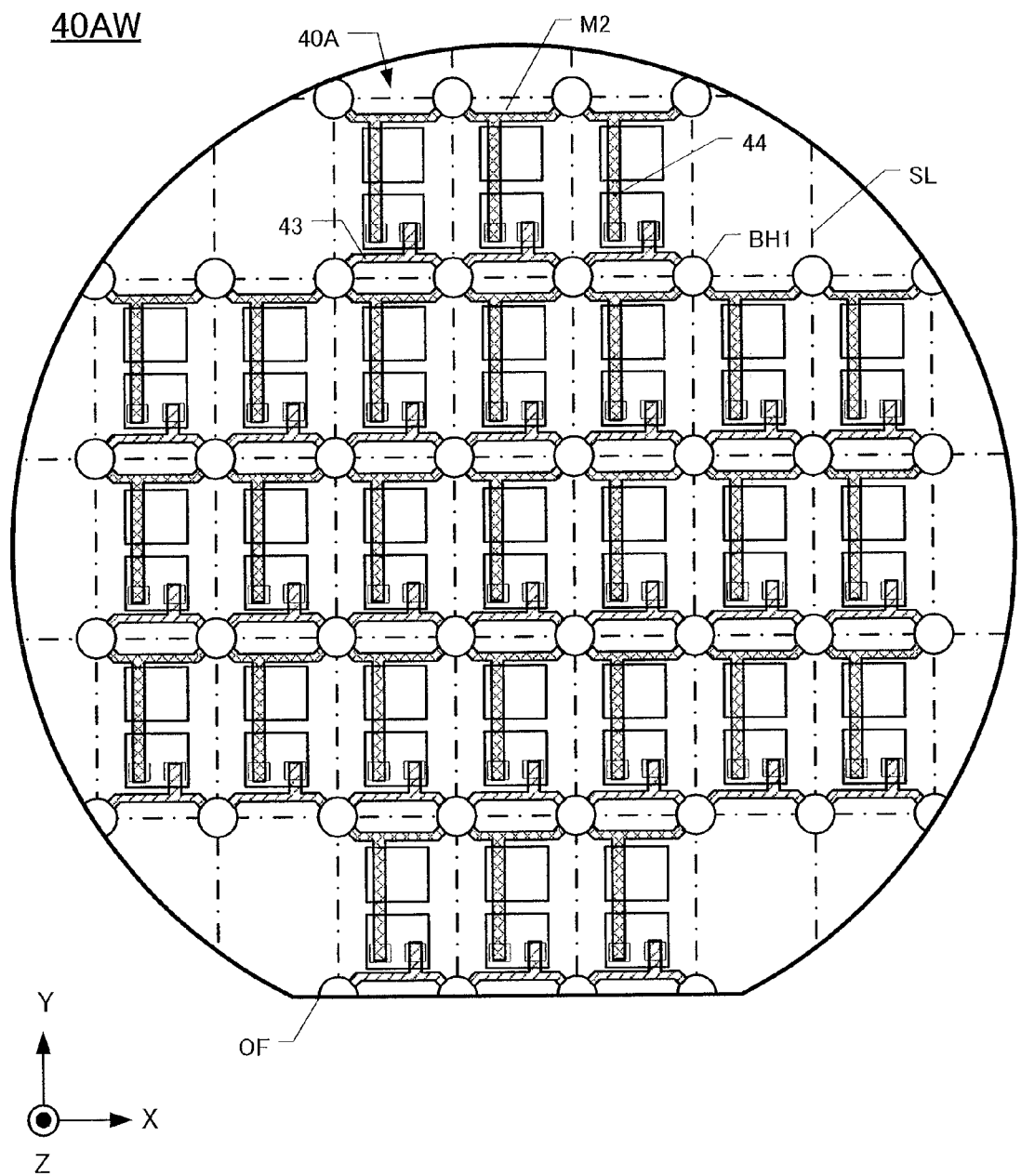
FIG. 8 is a plan view of the base wafer 40AW.

The second quartz-crystal device 110 in the second embodiment is described with references to FIGS. 6, 7 and 8.

FIG. 6 is an exploded perspective view of the second quartz-crystal device 110. In this drawing, the package lid 10 and the second package base 40A are drawn as separated. FIG. 7 is a cross-sectional view of the second quartz-crystal device 110 after bonding the package lid 10 and second package base 40A, taken along B-B' line. FIG. 8 is a plan view of the base wafer 40AW.

Regarding the second quartz-crystal device 110, the castellations 122 (122a, 122b, 122c and 122d) are formed on each corners of the second package base 40A, which is structurally different from the first quartz-crystal device 100. On the castellations 122, respective edge-surface electrodes 123 (123a, 123b, 123c and 123d) are formed, which is electrically connected to the external electrodes 51 and 52. On the other hand, the through-holes are not formed on the second quartz-crystal device 110. Since the through-holes are not formed, the protruding portions are not formed. In this embodiment, components that are similar to corresponding components in the first embodiment have the same respective reference numerals.

As shown in FIGS. 6 and 7, the second quartz-crystal device 110 comprises a tuning-fork quartz-crystal vibrating piece 30 mounted onto a second package base 40A, and a package lid 10. The second package base 40A and the package lid 10 are fabricated by quartz-crystal material. The second package base 40A and package lid 10 are bonded by the sealing material 48. The second package base 40A and package lid 10 are bonded to form a package defining a cavity 22 (refer to FIG. 7), filled with inert gas or in a vacuum.

The second package base 40A have an inner surface facing toward the package lid 10 defining a base recess 47, a pair of seats 45a, a buffer 46 and a frame 49. The frame 49 has a second connecting surface M2. The pair of external electrodes 51 and 52 is formed on the mounting surface M3. Each corners of the second package base 40A has two pairs of side castellations 122a and 122b, and side castellations 122c and 122d, respectively. The side castellations 122a and 122b, and side castellations 122c and 122d are formed from corresponding full-round cut-holes BH1 (refer to FIG. 8) by dicing cuts.

The external electrode 51 is connected to the edge-surface electrodes 123a and 123b, and the external electrode 51 is connected to the edge-surface electrodes 123c and 123d. The edge-surface electrodes 123a and 123b are connected to the first connecting electrode 43. The edge-surface electrodes 123c and 123d are connected to the second connecting electrode 44.

As shown in FIG. 7, the sealing material 48 applied in between the first bonding surface M1 on the package lid 10 and the second bonding surface M2 on the second package base 40A bonds the package lid 10 and the second package base 40A. Since the sealing material 48 is non electric conductive, the sealing material 48 does not short the first connecting electrode 43 and second connecting electrode 44.

As shown in FIG. 7, an overflowing sealing material 48 applied onto the first bonding surface M1 flows into the cavity 22. In order to prevent the tuning-fork type quartz-crystal vibrating piece 30 from contacting the sealing material 48, a gap is formed as a part of the base recess 47 between the second bonding surface M2 of the frame 49 and the seat 45a. Therefore, even if the overflowing sealing material 48 flows into the cavity 22, the tuning-fork type quartz-crystal vibrating piece is protected from contacting the sealing material 48. Similarly, even if the overflowing sealing material 48 flows into the second bonding surface M2 on the frame 49, the tuning-fork type quartz-crystal vibrating piece 30 is prevented from contacting the overflowing sealing material 48.

<Manufacturing Method of the Second Quartz-crystal Device 110>

The manufacturing method of the second quartz-crystal device 110 in FIG. 6 essentially follows the same method as the first embodiment indicated in FIG. 3. An additional explanation is made using the flow-chart in FIG. 3, to differentiate the second package base 40A on the second quartz-crystal device, in comparison to the first package base 40.

In step S122, a base wafer 40AW is prepared. Then the full-round cut-holes BH1 (refer to FIG. 8) are formed on the four corners of the base wafer 40AW by etching so as to extend depthwise through the base wafer 40AW. Each respective full-round cut-holes BH1 forms respective quarter-round castellations 122a, 122b, 122c and 122d (refer to FIG. 6) whenever the full-round cut-holes are cut into four sections. The second package base 40A has a base recess 47, a pair of seats 45a, a buffer 46 and a second connecting surface M2, all facing toward the package lid 10. The seat 45a, a buffer 46 and a frame 49 are formed by one etching process, and the full-round cut-holes BH1 are formed.

In step S124, the metal layers are formed on the mounting surface M3 on the base wafer 40AW and the full-round cut-hole BH1 by sputtering or vacuum-deposition.

Next, using an exposure tool (not shown), the profiles outlines of the external electrodes 51 and 52 and edge-surface electrodes 123a, 123b, 123c and 123d are exposed onto the base wafer 40AW. Then, the metal layers exposed onto the photoresist are etched. As shown in FIGS. 6 and 7, the external electrodes 51 and 52 are formed onto the mounting surface of the base wafer 40AW, and the edge-surface electrodes 123a, 123b, 123c and 123d are formed around the full-round cut-hole BH1.

Third Embodiment

<Overall Configuration of Third Quartz-Crystal Device 120>

Figure 9:
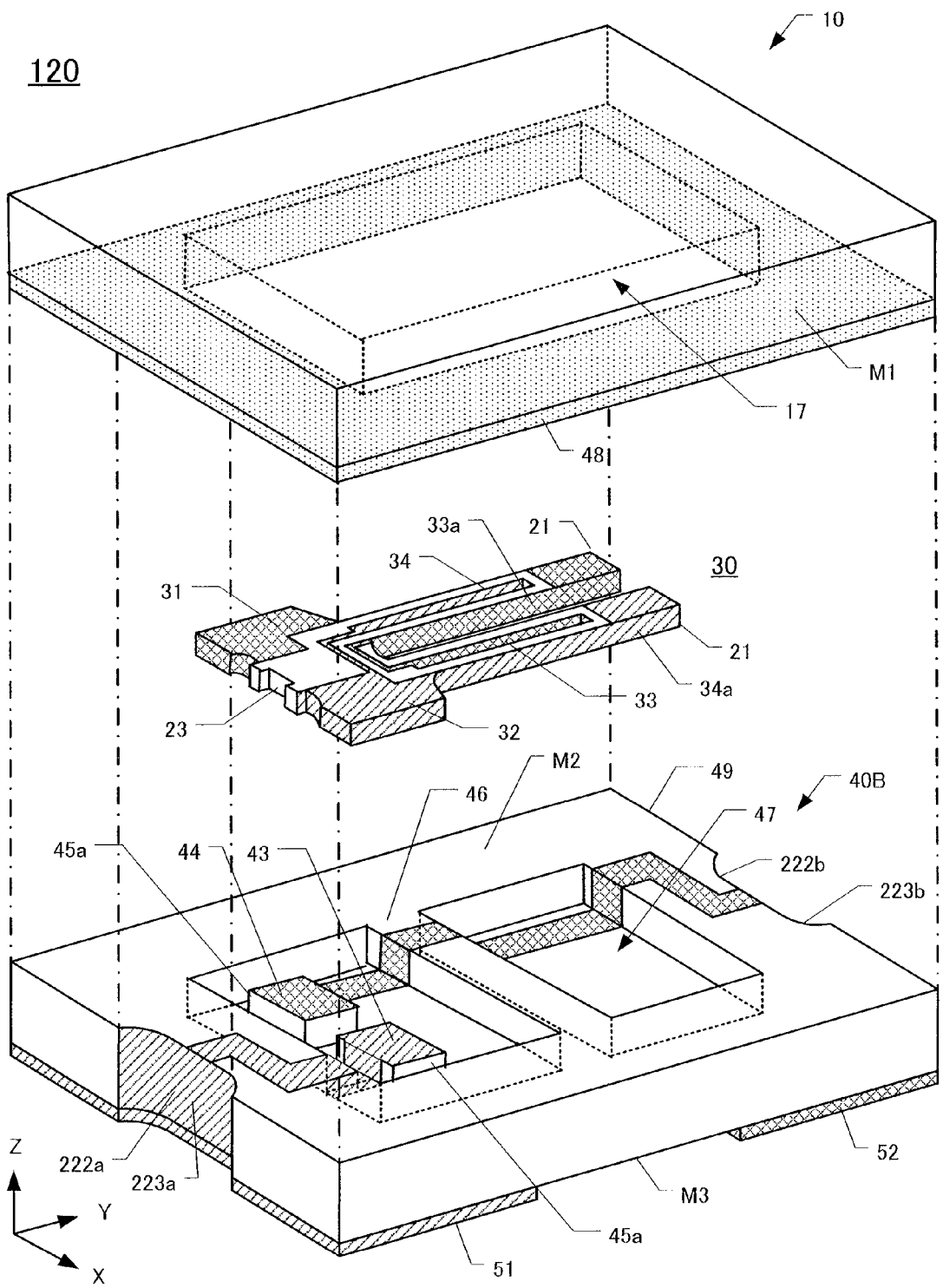
FIG. 9 is an exploded perspective view of the third quartz-crystal device 120.
Figure 10:
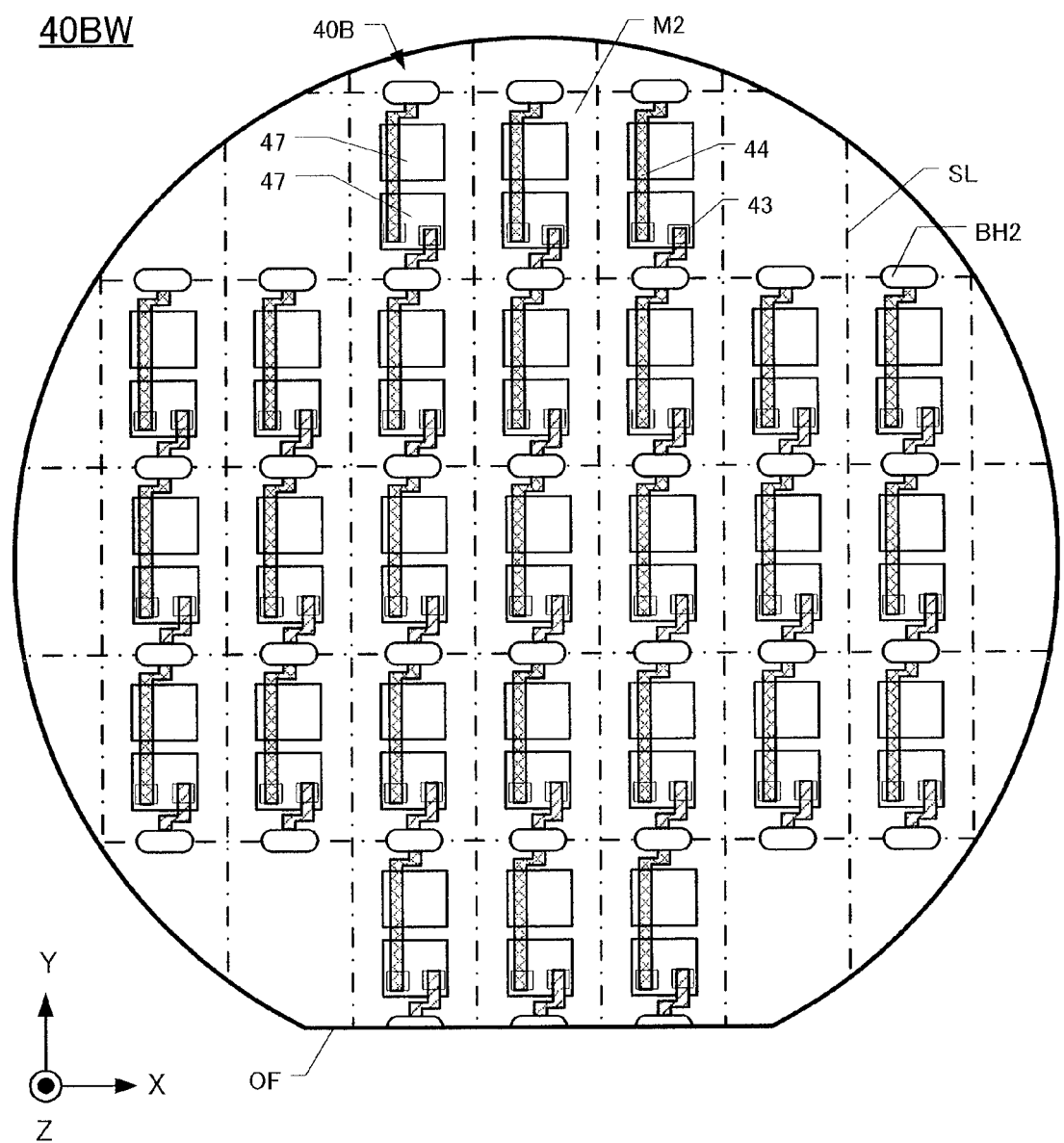
FIG. 10 is a plan view of the base wafer 40BW.

Overall configuration of the third quartz-crystal device 120 is explained using FIGS. 9 and 10 as a reference.

FIG. 9 is an exploded perspective view of the third quartz-crystal device 120, viewed from the package lid 10. FIG. 10 is a plan view of the base wafer 40BW. On the third quartz-crystal device 120, the castellations have a different shape and are disposed in a different position, in comparison to the second embodiment. In the third embodiment, components that are similar to corresponding components in the first embodiment have the same respective reference numerals.

On the third package base 40B, a pair of external electrodes 51 and 52 is formed on the mounting surface M3, and a pair of castellations 222a and 222b is formed on both sides of the third package base 40B in Y-axis direction, respectively. On the castellation 222a, an edge-surface electrode 223a is formed, which is connected to the external electrode 51, and on the castellation 222b, and an edge-surface electrode 223b is formed, which is connected to the external electrode 52. On the second bonding surface M2 of the third package base 40B, a base recess 47 and a pair of seats 45a, a buffer 46, and frame 49 (refer to FIGS. 9 and 10) are formed. Castellations 222a and 222b are formed when track-shaped (oval) cut-holes BH2 are diced (refer to FIG. 10).

<Manufacturing Method of the Third Quartz-Crystal Device 120>

The manufacturing method of the third quartz-crystal device 120 in FIG. 9 essentially follows the same method as the manufacturing method explained in the second embodiment.

In the following fourth, fifth, sixth and seventh embodiments, the AT-cut quartz-crystal vibrating piece are used as a piezoelectric vibrating piece. An AT-cut quartz-crystal vibrating piece is tilted 35° 15" along the Y-axis of a quartz-crystal axis (XYZ) in the direction of the Y-axis, from the Z-axis around the X-axis. Thus, in the quartz-crystal device 130 to 160 in the following embodiments, new longitudinal axes of the quartz-crystal vibrating piece are denoted as the x-axis direction, short-side axes are denoted as the z-axis direction and the height direction as the y-axis direction. The package lids and package bases are denoted similarly with respect to the quartz-crystal device, indicating the longitudinal direction as the x-axis direction, short-side axes as the z-axis direction and the height direction as the y-axis direction.

Fourth Embodiment

<Overall Configuration of the Fourth Quartz-Crystal Device 130>

Figure 11:
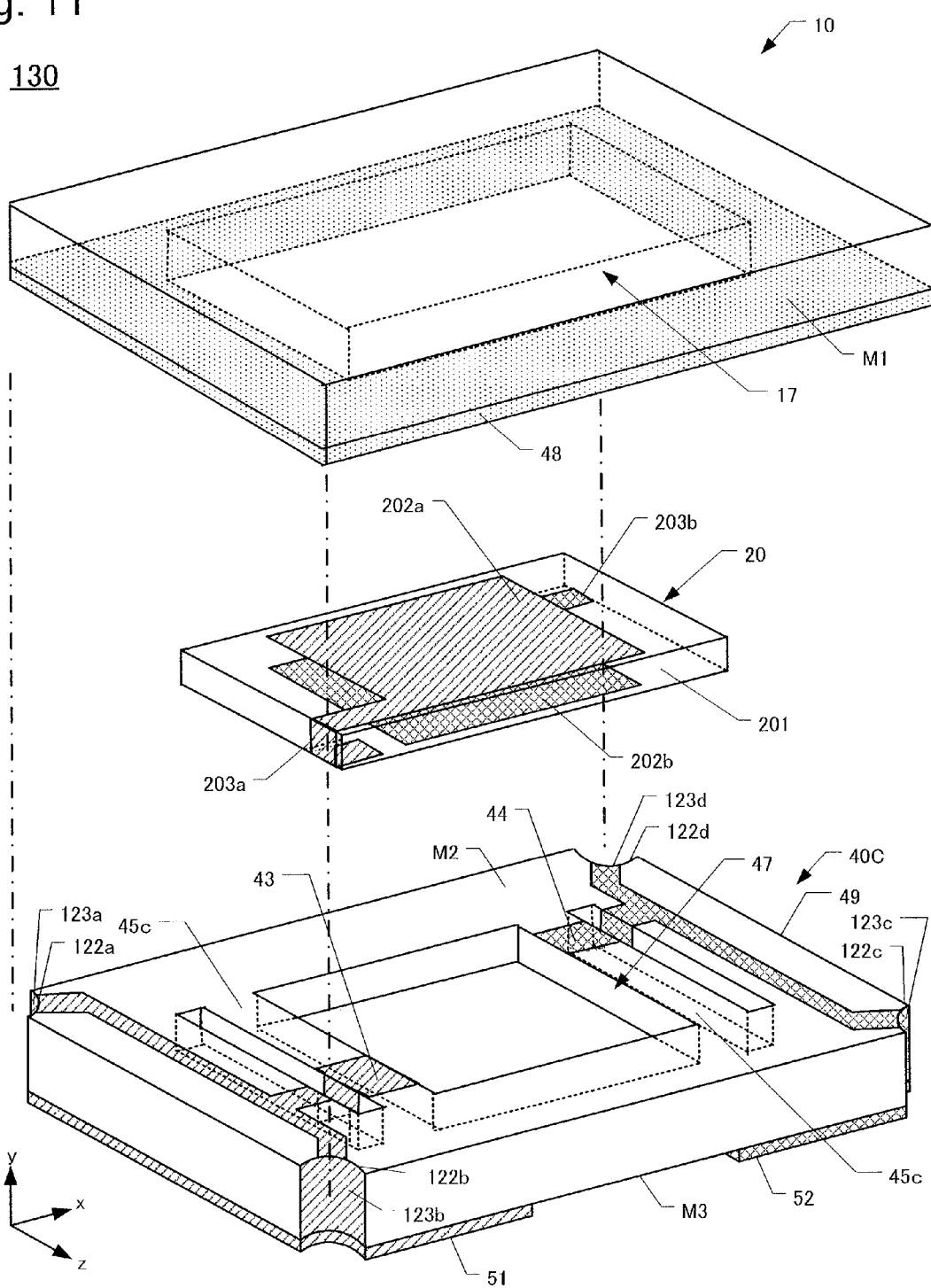
FIG. 11 is an exploded perspective view of the fourth quartz-crystal device 130.

The fourth quartz-crystal device 130 is explained using FIG. 11 as a reference.

FIG. 11 is an exploded perspective view of the fourth quartz-crystal device 130, viewed from the package lid 10.

The fourth quartz-crystal device 130 has a different position and shape of a seat on the base from the second quartz-crystal device 110. Also, the first AT-cut quartz-crystal vibrating piece 20 is mounted onto the first AT-cut quartz-crystal vibrating piece 20, instead of the tuning-fork type quartz-crystal vibrating piece 30 of the second quartz-crystal device 110. In this embodiment, components that are similar to corresponding components in the second embodiment have the same respective reference numerals.

The first AT-cut quartz-crystal vibrating piece 20 comprises the AT-cut quartz-crystal piece 201, and on both principal surfaces of the center of the quartz-crystal piece 201, a pair of excitation electrodes 202a and 202b is disposed oppositely each other.

The excitation electrode 202a is connected to the extraction electrode 203a formed on the bottom surface of the AT-cut quartz-crystal piece 201, so as to extend to one end in −y-axis side, and the excitation electrode 202b is connected to the extraction electrode 203b formed on bottom surface of the AT-cut quartz-crystal piece 201, so as to extend to the other end in +y-axis side. The first AT-cut quartz-crystal vibrating piece 20 is bonded to the connecting electrodes 43 and 44 formed on the fourth package base 40C with electrically conductive adhesive.

On the fourth package base 40C, a pair of external electrodes 51 and 52 is formed on the mounting surface M3, and castellations 122a, 122b, 122c and 122d are formed on corners of the fourth package base 40C, respectively. The edge-surface electrodes 123a and 123b formed on respective castellations 122a and 122b are connected to the external electrode 51, and the edge-surface electrodes 123c and 123d formed on respective castellations 122c and 122d are connected to the external electrode 52.

The fourth package base 40C has an inner surface facing toward the package lid 10 defining a concavity that forms a base recess 47. By forming the base recess 47, a pair of seats 45c is formed in a way that they protrude from the bottom surface of the base recess 47. The seat 45c on one side is disposed on 122a and 122b, the seat 45c on the other side is disposed on 122c and 122d, and both seats 45c are connected to the frame 49 on opposed sides. The connecting electrode 43 is formed on one side of the seat 45c, electrically connecting to the external electrode 51. The connecting electrode 44 is formed on the other side of the seat 45c, electrically connecting to the external electrode 52.

<Manufacturing Method of the Fourth Quartz-Crystal Device 130>

The manufacturing method of the fourth quartz-crystal device 130 in FIG. 11 essentially follows the same method as the manufacturing method explained in the second embodiment. An additional explanation is made using the flow-chart in FIG. 3, to differentiate the first AT-cut quartz-crystal vibrating piece 20 from the tuning-fork type quartz-crystal vibrating piece 30.

In step S112, a plurality of outer contours of the first AT-cut quartz-crystal vibrating pieces 20 are formed on the quartz-crystal wafer 201W (not shown) by etching. The metal layer (chromium or gold layer) is formed on both surface of the quartz-crystal wafer 201W having contour of the first AT-cut quartz-crystal vibrating piece by sputtering or vacuum-deposition. An exemplary thickness of the chromium foundation layer is in the range of 150 Å to 500 Å, and an exemplary thickness of gold layer is in the range of 400 Å to 800 Å.

In step S114, a photoresist is uniformly applied on entire surface of the metal layer. Using an exposure tool (not shown), outline profiles of excitation electrodes 202a and 202b, and extraction electrodes 203a and 203b are imprinted in the photoresist layers on each AT-cut quartz-crystal wafer 201W. Next, regions of the gold layers denuded by removal of the photoresist are etched away. Respective excitation electrodes 202*a* and 202*b*, and extraction electrodes 203*a* and 203*b* are formed on both surfaces of the first AT-cut quartz-crystal vibrating piece, as shown in FIG. 11.

In step S116, respective first AT-cut quartz-crystal vibrating piece 20 is removed from the AT-cut quartz-crystal wafer 201W. After cutting the AT-cut quartz-crystal vibrating piece 20 from the quartz-crystal wafer 201W, the electrodes can be formed onto respective quartz-crystal vibrating piece 20 by etching or metal-masking.

Fifth Embodiment
<Overall Configuration of Fifth Quartz-crystal Device 140>

Figure 12:
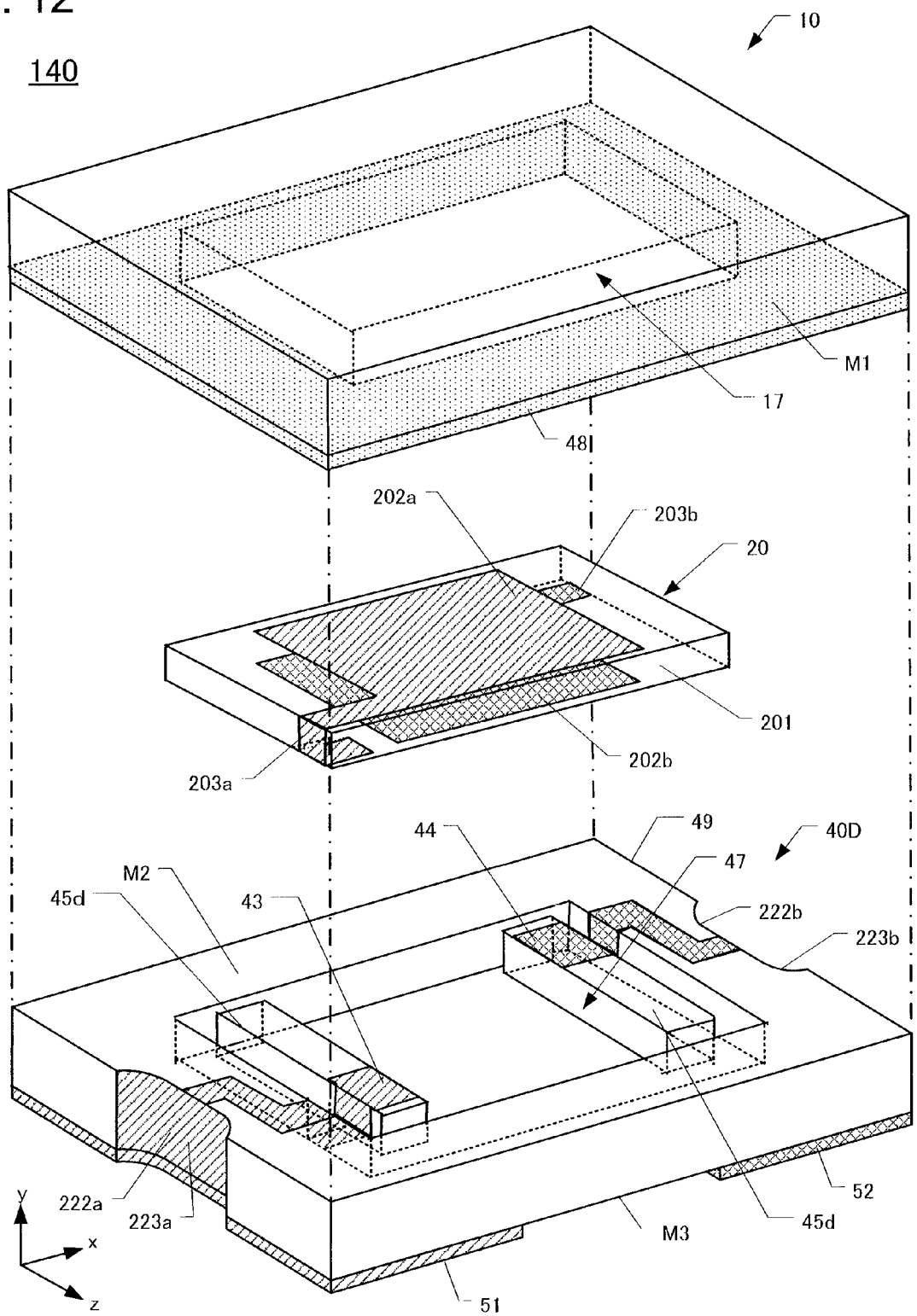
FIG. 12 is an exploded perspective view of the fifth quartz-crystal device 140.

Overall configuration of the fifth quartz-crystal device 140 is explained using FIG. 12 as a reference.

FIG. 12 is an exploded perspective view of the fifth quartz-crystal device 140. The fifth quartz-crystal device 140 has different position and shape of a castellation on the fifth package base 40D from the fourth quartz-crystal device 130. Also, the shape of a seat 45*d* is different from previous embodiments. In this embodiment, components that are similar to corresponding components in the fourth embodiment have the same respective reference numerals.

On the fifth package base 40D, a pair of external electrodes 51 and 52 is formed on the mounting surface M3, and a pair of castellations 222*a* and 222*b* is formed on both sides of the fifth package base 40D in x-axis direction, respectively. On the castellation 222*a*, an edge-surface electrode 223*a* is formed, which is connected to the external electrode 51, and on the castellation 222*b*, an edge-surface electrode 223*b* is formed, which is connected to the external electrode 52. On the second bonding surface M2 of the fifth package base 40D, a base recess 47 and a pair of seats 45*d* and frame 49 are formed. A pair of seats 45*d* is protruding from bottom of the base recess 47. The seat 45*d* on one side is disposed on castellation 222*a*, the seat 45*d* on the other side is disposed on castellation 222*b*, and both seats 45*d* are not connected to the frame 49 on opposed sides. The castellations 222*a* and 222*b* are formed when track-shaped cut-holes are diced.

<Manufacturing Method of the Fifth Quartz-crystal Device 140>

The manufacturing method of the fifth quartz-crystal device 140 in FIG. 12 essentially follows the same method as the manufacturing method of the fourth quartz-crystal device 130.

Sixth Embodiment
<Overall Configuration of the Sixth Quartz-Crystal Device 150>

Figure 13:
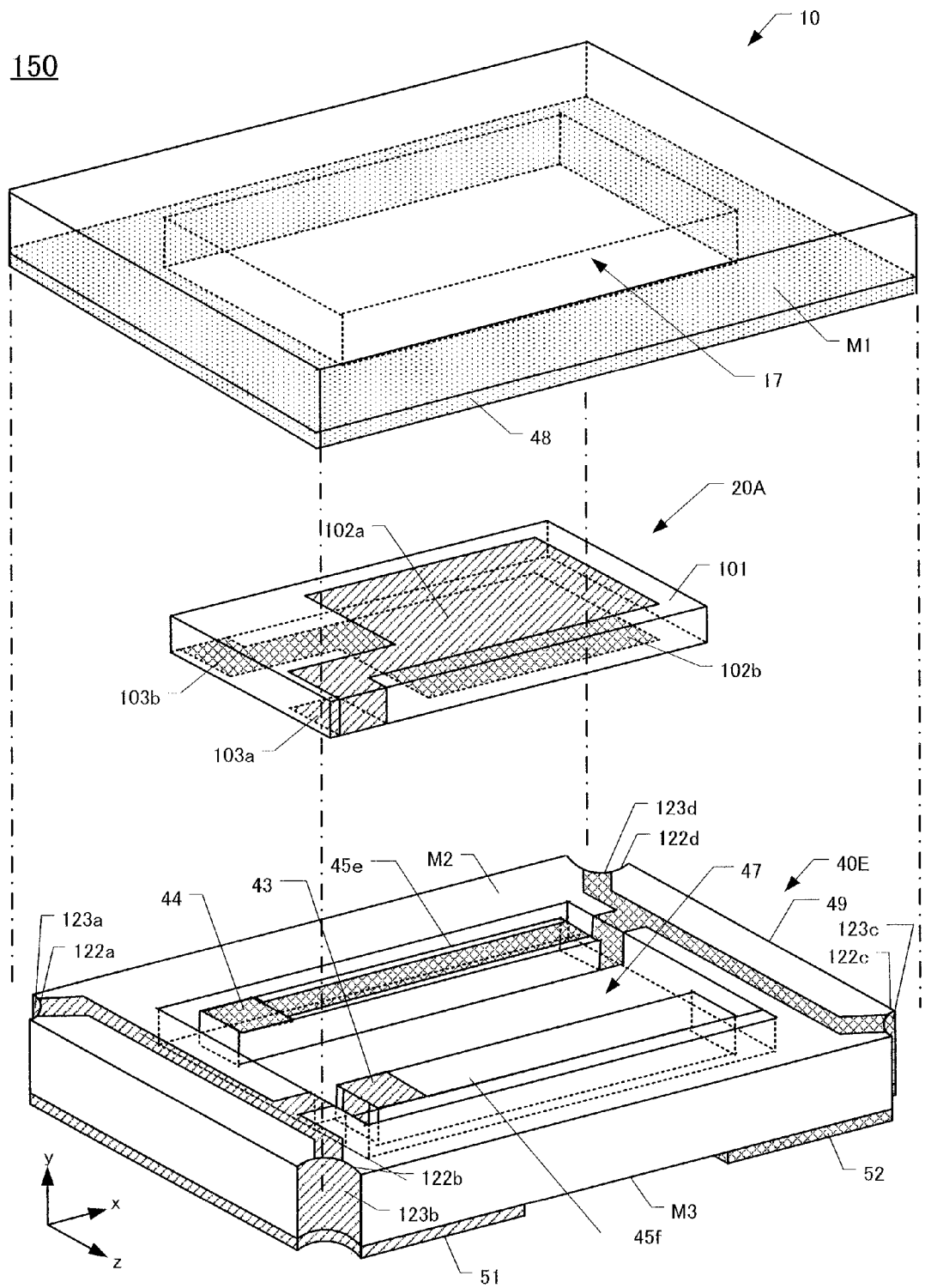
FIG. 13 is an exploded perspective view of the sixth quartz-crystal device 150.

The configuration of the sixth quartz-crystal device 150 is explained with FIG. 13 as a reference.

FIG. 13 is an exploded perspective view of the sixth quartz-crystal device 150 viewed from the package lid 10. In the sixth quartz-crystal device 150, the second AT-cut quartz-crystal vibrating piece 20A is disposed, in place of the first AT-cut quartz-crystal vibrating piece 20, to be supported on one end. Also, the shape and position of the seat 45*e* and 45*f* on the fourth package base 40C is different from previous embodiments. In this embodiment, components that are similar to corresponding components in the fourth embodiment have the same respective reference numerals.

The second AT-cut quartz-crystal vibrating piece 20A comprises the AT-cut quartz-crystal piece 101, and a pair of excitation electrodes 102*a* and 102*b* is formed oppositely from each other, substantially in the center of each surface of the quartz-crystal piece 101. The excitation electrode 102*a* is connected to the extraction electrode 103*a*, which is formed on one end of the quartz-crystal piece 101 in −y-axis direction, and the excitation electrode 101*b* is connected to the extraction electrode 103*b*, which is formed on the same end in −y-axis direction of the AT-cut quartz-crystal piece 201. The second AT-cut quartz-crystal vibrating piece 20A is bonded onto the connecting electrodes 43 and 44 formed on the sixth package base 40E via electrically conductive adhesive.

The sixth package base 40E has an inner surface facing toward the package lid 10 defining a concavity that forms a base recess 47. By forming the base recess 47, a seat 45*e* and 45*f* are formed in a way that they protrude from bottom surface of the base recess 47. The seats 45*e* and 45*f* are disposed in parallel to two sides of the frame 49 that are formed oppositely to z-axis directions. The seats 45*e* and 45*f* are not connected to the sides of the frame 49 disposed oppositely. On one seat 45*e*, the connecting electrode 44 is formed, which is connected to the external electrode 52. On the other seat 45*f*, the connecting electrode 43 is formed, which is connected to the external electrode 51.

<Manufacturing Method of the Sixth Quartz-crystal Device 150>

The manufacturing method of the third quartz-crystal device 150 in FIG. 13 essentially follows the same method as the manufacturing method of the fourth quartz-crystal device 130 explained in the fourth embodiment.

Seventh Embodiment
<Configuration of the Seventh Quartz-Crystal Device 160>

Figure 14:
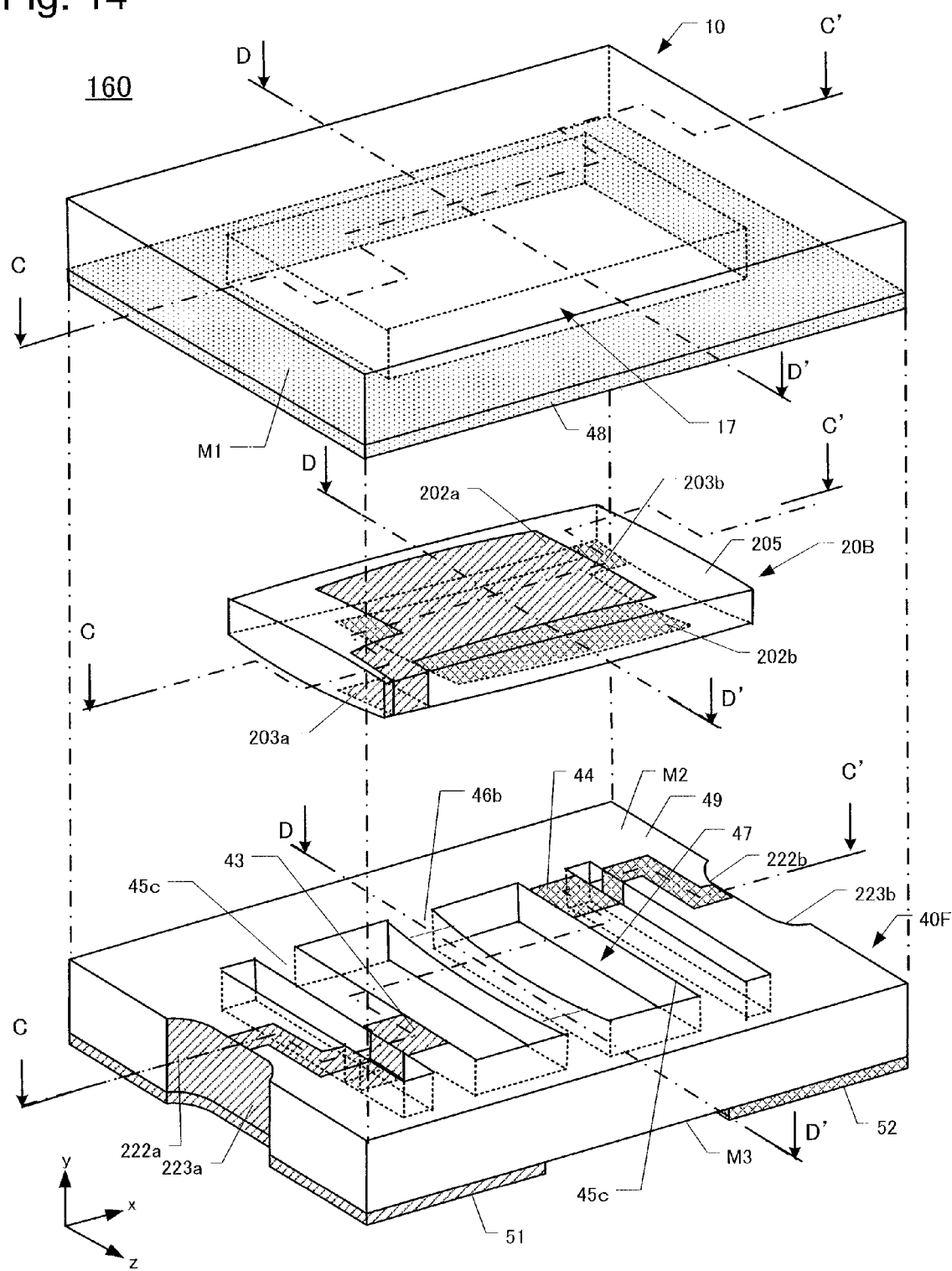
FIG. 14 is an exploded perspective view of the seventh quartz-crystal device 160.

The configuration of the seventh quartz-crystal device 160 is explained with FIGS. 14 and 15 as references.

FIG. 14 is an exploded perspective view of the seventh quartz-crystal device 160, viewed from the package lid 10, FIG. 15A is a cross-section of the seventh quartz-crystal device 160 taken along C-C' line, and FIG. 15B is a cross-section of the seventh quartz-crystal device 160 taken along D-D' line. On FIGS. 15A and 15B, a convex-shaped quartz-crystal vibrating piece 20B is drawn in magnified manner. In the seventh quartz-crystal device 160, a third AT-cut convex-shaped quartz-crystal vibrating piece 20B is mounted, in place of the first AT-cut quartz-crystal vibrating piece 20. Also, the shape of a seat 45*c* on the seventh package base 40F differs from previous embodiments, and the buffer 46*b* is disposed to accommodate the third AT-cut convex-shaped quartz-crystal vibrating piece 20B. In the seventh embodiment, components that are similar to corresponding components in the fifth embodiment have the same respective reference numerals.

As shown in FIG. 14, the third AT-cut quart-crystal vibrating piece 20B comprises the convex-shaped quartz-crystal piece 205. For example, cross-section of the quartz-crystal vibrating piece is convex-shaped, formed thicker toward the center where the excitation electrode is formed, and formed thinner toward respective distal ends. A pair of excitation electrodes 202*a* and 202*b* is disposed oppositely from each other, substantially in the center of each surface of the quartz-crystal piece 205. The excitation electrode 202*a* is connected to the extraction electrode 203*a*, which is extended to one end of bottom surface of the quartz-crystal piece 205 in −y-axis direction, and the excitation electrode 202*b* is connected to the extraction electrode 203*b*, which is extended to the other end of bottom surface of the quartz-crystal piece 205 in −y-axis direction. The third AT-cut convex-shaped quartz-crystal vibrating piece 20B is bonded onto the connecting electrode 43 and 44 formed on the seventh package base 40F via electrically conductive adhesive 61 (refer to FIG. 15).

On the seventh package base 40F, a pair of external electrodes 51 and 52 is formed on the mounting surface M3, and a pair of respective castellations 222a and 222b is disposed on both sides toward x-axis direction of the seventh package base 40F. The edge-surface electrode 223a is formed on the castellation 222a, which is connected to the external electrode 51, and the edge-surface electrode 223b is formed on the castellation 222b, which is connected to the external electrode 52. The second bonding surface M2 of the seventh package base 40F has a base recess 47, a pair of seats 45c, a buffer 46b and a frame 49. The pair of seats 45c is formed in a way that it protrudes from bottom surface of the base recess 47. One seat 45c is disposed on side of the castellation 222a, the other seat 45c is disposed on side of the castellation 222b, and both seats 45c are connected to the frame 49 on opposed sides.

As shown in FIGS. 15A and 15B, the buffer 46b on the seventh package base 40F is curved to accommodate the third AT-cut convex-shaped quartz-crystal vibrating piece 20B. The buffer 46b is situated, so that when the third AT-cut convex-shaped quartz-crystal vibrating piece 20B is shaken due to the external shock, the external electrodes 203a and 203b, and the connecting electrodes 43 and 44 remain undamaged. The length of the third AT-cut convex-shaped quartz-crystal vibrating piece 20B and the buffer 46b equals to the thickness of the electrically conductive adhesive 61 and the connecting electrode combined. Although the convex-shaped quartz-crystal vibrating piece 20B is explained in this seventh embodiment, when the mesa-shaped quartz-crystal vibrating piece is used instead of the convex-shaped quartz-crystal vibrating piece, the buffer can be replaced with stepped recess.

INDUSTRIAL APPLICABILITY

Representative embodiments are described above; however, it will be obvious to persons who are skilled in the relevant art to modify the invention based on this disclosure. For example, instead of a quartz-crystal material, the package lids and package bases can be fabricated by a glass plate.

In this disclosure, although the various embodiments have been described in the context of the quartz-crystal vibrating pieces, it will be understood that the embodiments can be applied with equal facility to piezoelectric materials such as lithium tantalite and lithium niobate. Further, although the low-melting-point glass was applied as a sealing material, it can be replaced with other non electric conductive resin adhesives, such as polyimide resin. Furthermore, the present disclosure can be applied to piezoelectric oscillators that also include an IC configured as an oscillating circuit mounted inside the package on the package base.

What is claimed is:

1. A piezoelectric device for storing a piezoelectric piece having a pair of excitation electrodes, the piezoelectric device comprising:
    a package lid, defining a lid recess surrounded by a peripheral first bonding surface;
    a package base, defining a base recess surrounded by a peripheral second bonding surface configured to mate with said first bonding surface to define an interior space, said base including a pair of seats protruding from the base recess into said interior space and situated for mounting the piezoelectric piece, and a pair of external electrodes on a mounting surface opposite said second bonding surface;
    a piezoelectric piece mounted onto the pair of seats; and
    an electrically non-conductive sealing material disposed between said first and second bonding surfaces, for bonding the first bonding surface and the second bonding surface;
    wherein a first height of the second bonding surface and a second height of the pair of seats with respect to said mounting surface are the same,
    wherein as viewed from above the package lid, the package base has a rectangular profile; and the package base comprises a pair of castellations formed in a periphery of the rectangular profile; and a pair of connecting electrodes extend from the pair of external electrodes across the pair of castellations and connect to the pair of seats.

2. The piezoelectric device of claim 1, comprising a buffer formed to protrude from the base recess for protecting the piezoelectric piece when the piezoelectric piece is shaken due to an external shock,
    wherein the height of the buffer is formed as the same as that of the second bonding surface.

3. The piezoelectric device of claim 1, comprising a buffer formed to protrude from the base recess for protecting the piezoelectric piece when the piezoelectric piece is shaken due to an external shock,
    wherein the buffer has a sectional configuration that matches the sectional shape of the piezoelectric piece to define a space of substantially constant height between said piezoelectric piece and said buffer.

* * * * *